US012223012B2

(12) United States Patent
Burch et al.

(10) Patent No.: US 12,223,012 B2
(45) Date of Patent: Feb. 11, 2025

(54) MACHINE LEARNING VARIABLE SELECTION AND ROOT CAUSE DISCOVERY BY CUMULATIVE PREDICTION

(71) Applicant: PDF Solutions, Inc., Santa Clara, CA (US)

(72) Inventors: Richard Burch, McKinney, TX (US); Qing Zhu, Rowlett, TX (US); Jonathan Holt, Sachse, TX (US); Tomonori Honda, Santa Clara, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 1029 days.

(21) Appl. No.: 17/072,830

(22) Filed: Oct. 16, 2020

(65) Prior Publication Data
US 2021/0117861 A1 Apr. 22, 2021

Related U.S. Application Data

(60) Provisional application No. 62/916,171, filed on Oct. 16, 2019.

(51) Int. Cl.
*G06N 20/00* (2019.01)
*G06F 17/18* (2006.01)
*G06F 18/2113* (2023.01)
*G06N 5/04* (2023.01)

(52) U.S. Cl.
CPC .......... *G06F 18/2113* (2023.01); *G06F 17/18* (2013.01); *G06N 5/04* (2013.01); *G06N 20/00* (2019.01)

(58) Field of Classification Search
CPC .......................... G06F 18/2113; G06N 20/00
See application file for complete search history.

(56) References Cited

U.S. PATENT DOCUMENTS

| 2013/0268469 A1* | 10/2013 | Sharma ................ G06F 30/367 706/46 |
| 2015/0339572 A1 | 11/2015 | Achin et al. |
| 2017/0192088 A1 | 7/2017 | Fluhler |
| 2017/0286870 A1 | 10/2017 | Hoover et al. |
| 2019/0188612 A1* | 6/2019 | Cooper ................ G06Q 10/04 |
| 2019/0332769 A1 | 10/2019 | Fralick et al. |
| 2019/0333155 A1 | 10/2019 | Natesan et al. |
| 2019/0370634 A1* | 12/2019 | Ferreira Moreno ........................ H04L 63/0428 |
| 2020/0097817 A1 | 3/2020 | Harris et al. |
| 2020/0232909 A1 | 7/2020 | Atkins et al. |

OTHER PUBLICATIONS

Pourghasemi et al., "Gully erosion spatial modelling: Role of machine learning algorithms in selection of the best controlling factors and modelling process", Mar. 25, 2020. Retrieved from the internet <URL: https://www.sciencedirect.com/science/article/pii/S1674987120300645>.
International Search Report and Written Opinion, dated Jan. 15, 2021.

* cited by examiner

*Primary Examiner* — Claudia Dragoescu
(74) *Attorney, Agent, or Firm* — Dergosits & Noah LLP; Igor Shoiket

(57) ABSTRACT

A sequence of models accumulates r-squared values for an increasing number of variables in order to quantify the importance of each variable to the prediction of a targeted yield or parametric response.

6 Claims, 6 Drawing Sheets

| Group | Source | rsq.cv | rsq.inc | parNum |
|---|---|---|---|---|
| PCM-2 | PCM | 15.4 % | 15.4 % | 1 |
| PCM-1 | PCM | 27.8 % | 12.3 % | 2 |
| PE-1 | WEH | 37.7 % | 9.9 % | 3 |

FIG. 1

MACHINE LEARNING VARIABLE SELECTION AND ROOT CAUSE DISCOVERY BY CUMULATIVE PREDICTION

CROSS REFERENCE

This application claims priority from U.S. Provisional Application No. 62/916,171 entitled Machine Learning Variable Selection and Root Cause Discovery by Cumulative Prediction, filed Oct. 16, 2019, incorporated herein by reference in its entirety.

TECHNICAL FIELD

This application relates to semiconductor manufacturing processes, and more particularly, to a scheme for utilizing cumulative predictions by machine learning models to identify key process variables.

BACKGROUND

The two fundamental goals in utilizing machine learning and modeling for semiconductor manufacturing processes are accurate yield (or continuous parametric value) prediction, and root cause discovery. Root cause discovery involves the quantification of the importance of each variable in the model to the selected yield (or continuous parametric value) and the quantification of how important each variable is to each predicted observation.

Unfortunately, these two goals are often in opposition to each other. With simple models, such as linear regression, it is relatively easy to determine the most important variables overall and for each observation; however, these models are often inaccurate. With complex machine learning approaches, the predictions can be much more accurate; however, it remains very difficult to determine the importance of each variable both overall and for each observation.

It would be desirable to utilize the inherent power of the machine learning models to help quantify the importance of specific process variables.

BRIEF SUMMARY

A method is presented for identifying the importance of specific process variables. A sequence of models accumulates r-squared values for an increasing number of variables in order to quantify the importance of each variable to the prediction of a targeted yield or parametric response.

Initially, a machine learning model is configured to predict a target feature based on a plurality of process parameters provided as inputs to the machine learning model. A first one of the process parameters is selected and used to determine a first r-squared value for predicting the target feature. Then a second one of the process parameters is selected and used to determine a second r-squared value for predicting the target feature based on the second selected process parameter. As necessary, additional ones of the process parameters are selected and used to determine corresponding additional r-squared values for predicting the target feature based on the additional selected process parameters, until an accumulation of the first, second and additional r-squared values increases by less than a threshold value. The parameters can then be ranked according to their impact and identified as key inputs to machine learning models.

DESCRIPTION OF DRAWINGS

FIG. 1 is a table illustrating incremental and cumulative contribution to yield prediction due to selected process parameters.

DETAILED DESCRIPTION

Figure 2:
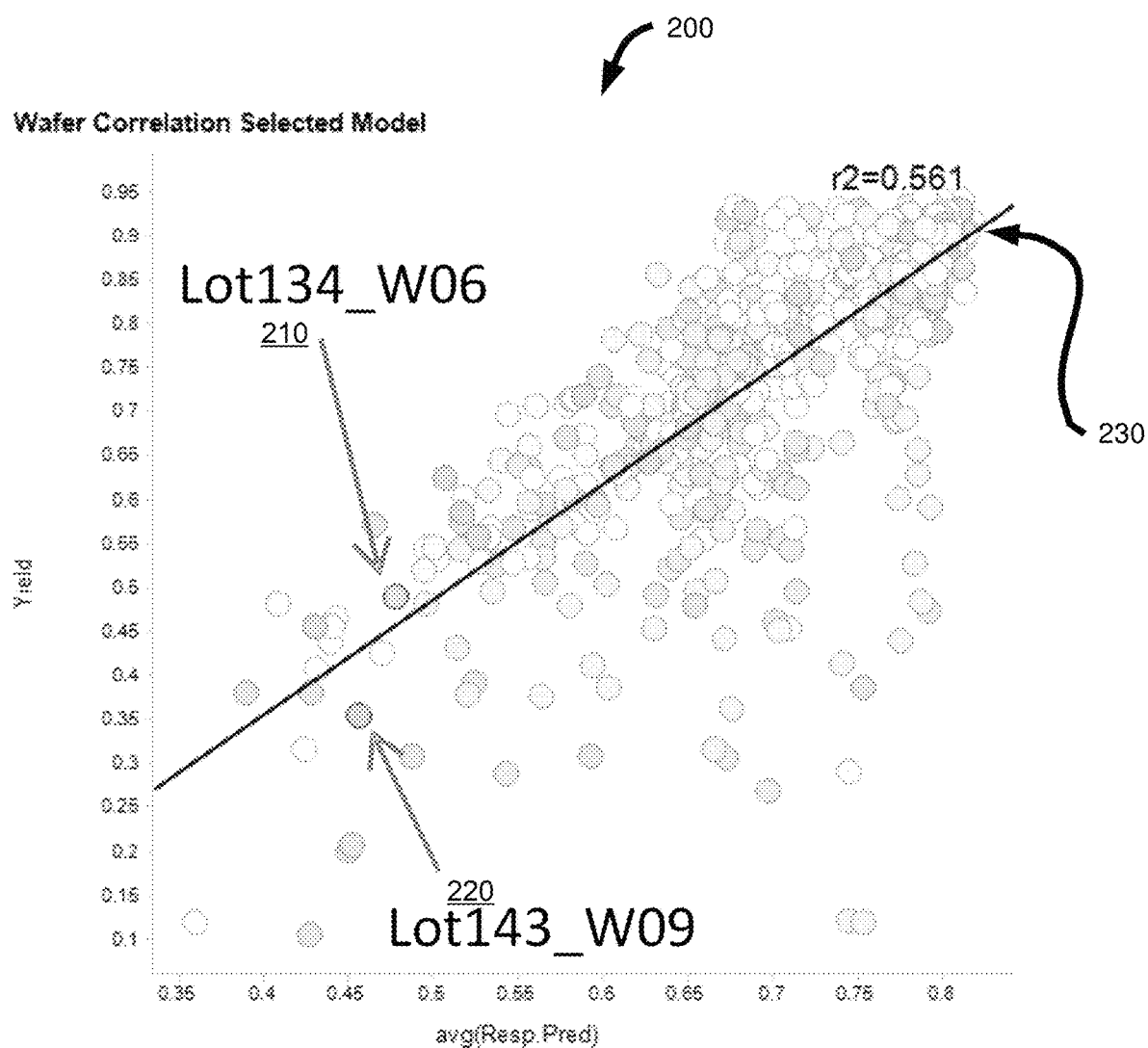
FIG. 2 is a graphical plot illustrating the wafer-level correlation between predicted yield and actual yield for a plurality of wafer samples based on the process parameters identifies in FIG. 1.

Machine learning (ML) is playing a more active role in modeling semiconductor processes, especially for prediction and root cause analysis. Some of the principals of stepwise regression can be used to optimize the input parameters for any complex ML approach (e.g., neural networks, extreme gradient boosting, etc.), and in particular, an ML model based on a cross-validated r-squared approach to remove variables that do not improve prediction on the training data and only keep those variables that are important to prediction.

However, that concept can be taken further by first building the best one-variable model possible. Next, build the best two-variable model possible, which by definition must include the variable from the best one-variable model; and then build the best three-variable model possible, which by definition must include the variables from the best two-variable model. This process is repeated until all variables are rank-ordered in terms of "most important" to "least important" or until the best n-variable model predicts a desired or acceptable percentage of the cross-validated r-squared values for all variables selected by the stepwise variable selection process.

Thus, a cumulative sequence of models can be used to quantify the importance of each variable to the overall prediction of a targeted yield (or continuous parametric) response based on an improvement in cross-validated r-squared values.

For example, FIG. 1 shows a table 100 with several process parameters listed entries in order to demonstrate how a cumulative improvement in yield performance results by using r-squared values as the measure. In table 100, rows 111, 112, 113 list selected wafer parameters, with the wafer group identifier listed in column 121, the source of the wafer parameter listed in column 122, the cumulative cross-validated r-squared percentage value listed in column 123, the incremental cross-validated r-squared percentage value of that parameter listed in column 124, and the parameter number, e.g., parameter ranking by incremental impact, listed in column 125.

The first parameter listed in row 111 is PCM-32, its source (column 122) is a continuous parametric measurement of a first physical test structure on the wafer, and its incremental contribution (column 124) to an identified variance or excursion is 15.4% based on the r-squared value from a statistical analysis. Adding the second parameter PCM-1 (row 112), a continuous parametric measurement of a second, different test structure on the same wafer, has an incremental impact of 12.4% and increases the explained cumulative variance to 27.8%, while adding the third parameter PE-1 (row 113), a process tool identified in the wafer equipment history (WEH), with an incremental impact of 9.9%, raises the cumulative variance total to 37.7%. Based on this cross-validated r-squared statistical analysis, these are the only three variables important enough, e.g., approximately 10% of more incremental contribution to the variance in this example, to include in the machine learning model.

Understanding how important each parameter is to the overall model is valuable, but may not be as valuable as understanding how important each parameter is to a particular observation. For example, several low yielding wafers might be best predicted by contact resistance changes, giving the user information that allows a more rapid diagnosis of the root cause. Consider how this works for a simple example data set.

FIG. 2 shows a correlation plot 200 of several hundred wafers predicted based on a machine learning model of actual yield versus the predicted yield for the parameters considered in FIG. 1, namely, PCM-1, PCM-2 and PE-1. Two randomly selected wafers 210, 220 from different lots (Lot134_W06 and Lot143_W09) are both well predicted in the final model, but the question is which parameters are important to each wafer.

First, the measures of accuracy are defined. Since this particular model was focused on predicting die and wafer yield, the two measures of accuracy are (i) the difference between predicted wafer yield and actual wafer yield, and (ii) the r-squared value in the die level correlation of predicted yield and actual yield across the wafer. For the die level correlation, the data is smoothed by averaging each die with the immediately surrounding die, as represented by line 230, to get a smoother representation of yield and yield prediction. The accuracy of wafer prediction is considered for each of the three cumulative predictions identified in FIG. 1.

Figure 3:
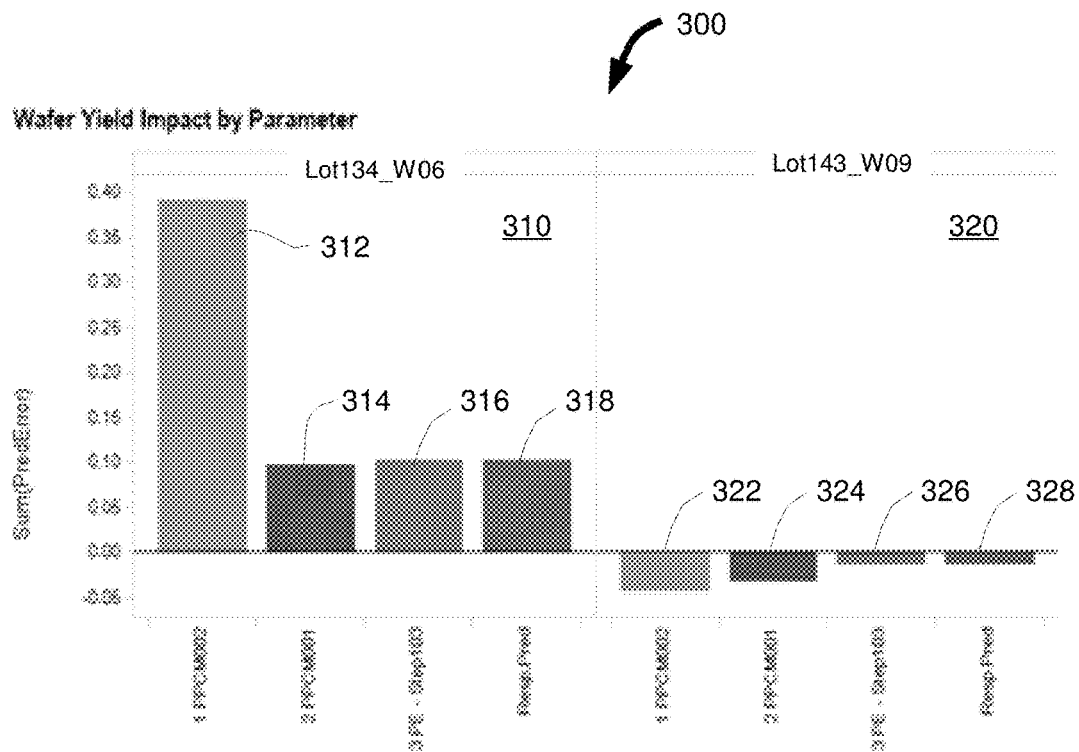
FIG. 3 is a bar graph illustrating the relative impact on yield of selected process parameters for two of the wafer samples from FIG. 2.

The wafer level prediction error for each cumulative model is shown in bar graph 300 in FIG. 3. The predicted error for wafer 210 (Lot134_W06) is shown on the left-hand bar graph 310 and the predicted error for wafer 220 (Lot143_W09) is shown on the right-hand bar graph 320. Bar graph 310 shows the wafer 210 has a very large error 312 when the prediction depends only on the single parameter PCM-2. However, the prediction error 314 is much better (i.e., lower) once parameter PCM-1 is included in the prediction. This implies that yield for wafer 210 (Lot134_W06) is being more driven by PCM-1 than other parameters since the prediction error does not change significantly (316, 318) when other parameters are considered. This can be confirmed by looking at the wafer level prediction plot of the first cumulative model versus the actual yield.

Similarly, the predicted error for wafer 220 (Lot143_W09) is driven primarily by PCM-2 since the predicted error 322 does not change much when other parameters (324, 326, 328) are also considered.

Figure 4:
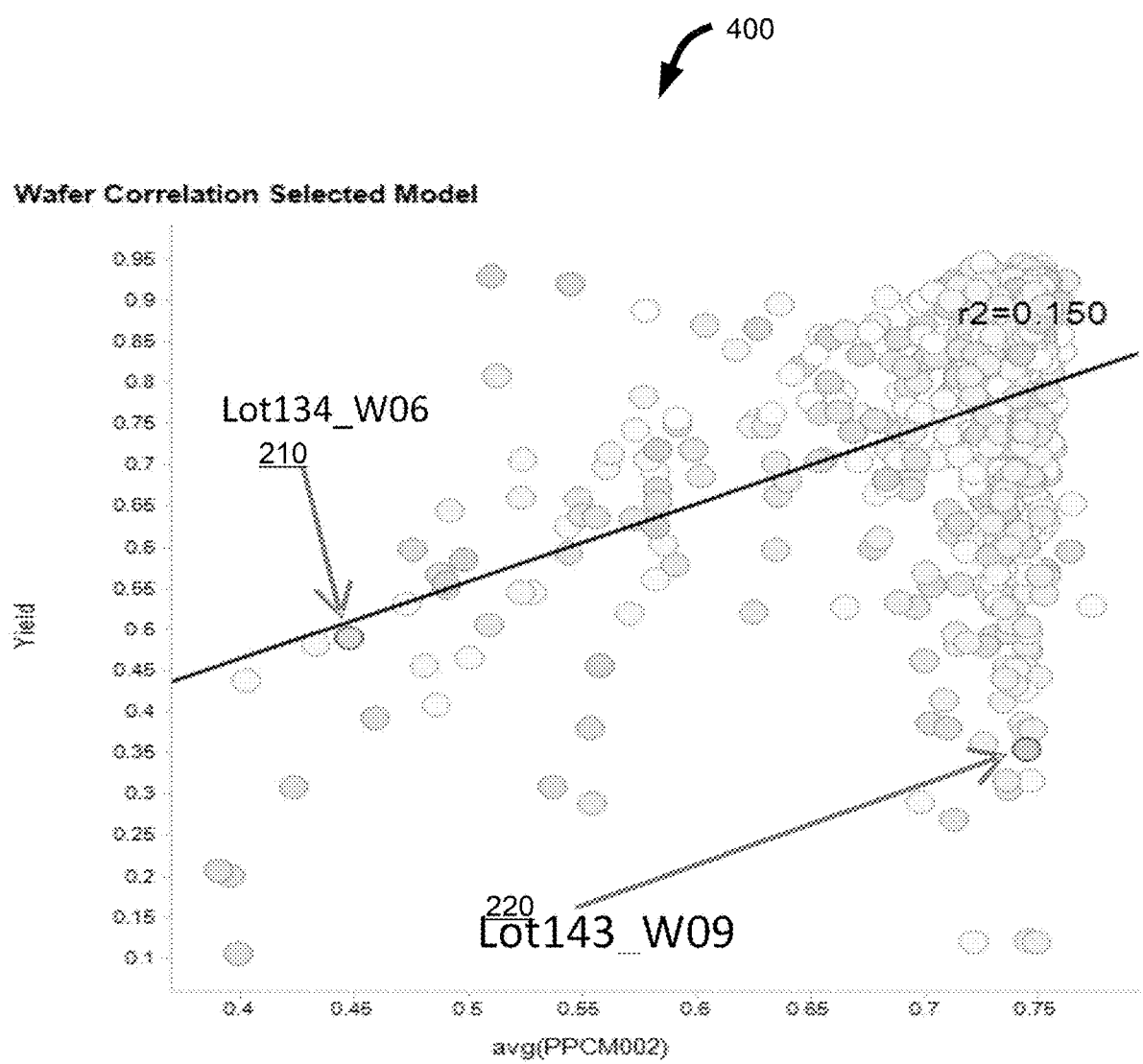
FIG. 4 is a graphical plot illustrating the wafer level correlation between actual yield predicted yield from a model built using only the most important input variable.

FIG. 4 is a wafer level plot 400 of yield versus the average value for PCM-2 and confirms that the yield loss for wafer 220 (Lot143_W09) is not predicted from the model using only PCM-2 since that point is so far off the average line. However, this model does a good job of predicting wafer 210 (Lot134_W06) since the point is very close to the average line which indicates that this wafer yield is primarily driven by PCM-2. This can be further confirmed by looking at the spatial correlation for the first model using only PCM-2 and the second cumulative model using both PCM-2 and PCM-1.

Figure 5:
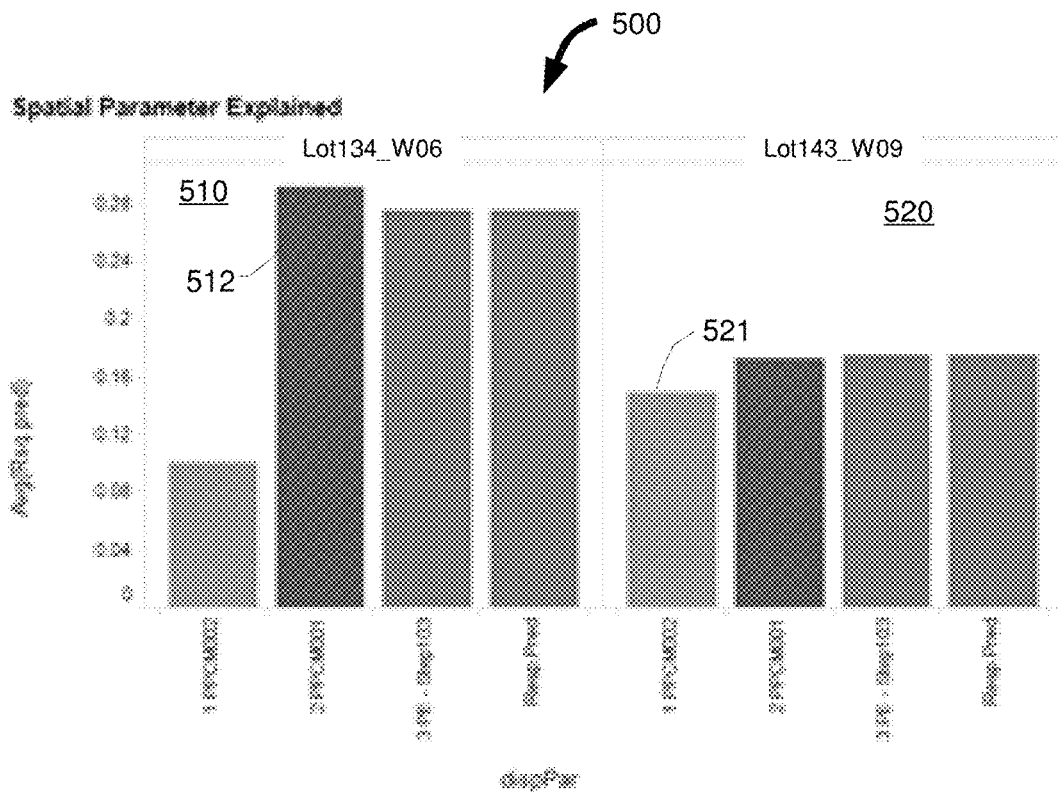
FIG. 5 is a bar graph illustrating the average of relative impact on yield of selected process parameters for two of the wafer samples from FIG. 2.

FIG. 5 is a bar graph 500 that shows the spatial r-squared values for each of the cumulative models for the two example wafers, wafer 210 (Lot134_W06) on the left-hand graph 510 and wafer 220 (Lot143_W06) on the right-hand graph 520. From graph 510, the wafer yield prediction shows that wafer 210 (Lot134_W06) was primarily predicted by the parameter PCM-1 since the plot of spatial r-squared is much better once PCM-1 is added to the model at plot 512, which is consistent with the wafer yield prediction. From graph 520, the wafer yield prediction shows that wafer 220 (Lot143_W09) was primarily predicted by the parameter PCM-2, as indicated by the first plot 521 and very similar spatial r-squared value for all four cumulative predictions.

Figure 6:
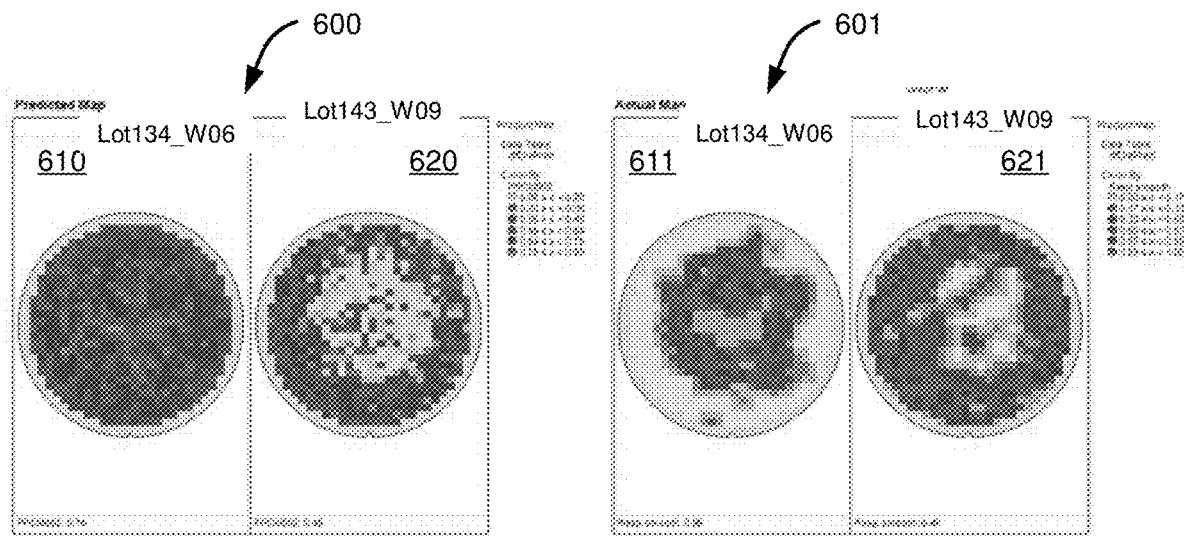
FIG. 6 are heat maps illustrating predicted spatial patterns and actual spatial patterns for two of the wafer samples from FIG. 2 after observation based on a single parameter.

As shown in FIG. 6, these same spatial pattern matches can easily be observed from the wafer maps of actual yield and cumulative model predictions. For example, window 600 shows the predicted map spatial pattern for wafer 210 (Lot134_W06) in the left-hand panel 610 and the predicted map spatial pattern for wafer 220 (Lot143_W09) in the right-hand panel 620 based on the single parameter PCM-2 Window 601 shows the actual map spatial pattern for wafer 210 (Lot134_W06) in the left-hand panel 611 and the actual map spatial pattern for wafer 220 (Lot143_W09) in the right-hand panel 621.

For wafer 220 (Lot143_W09), the first cumulative predicted model shown in panel 620 clearly matches fairly well with the actual map shown in panel 621. However, the predicted pattern for wafer 210 (Lot134_W06) in panel 610 does not match well with the actual pattern shown in panel 611

Figure 7:
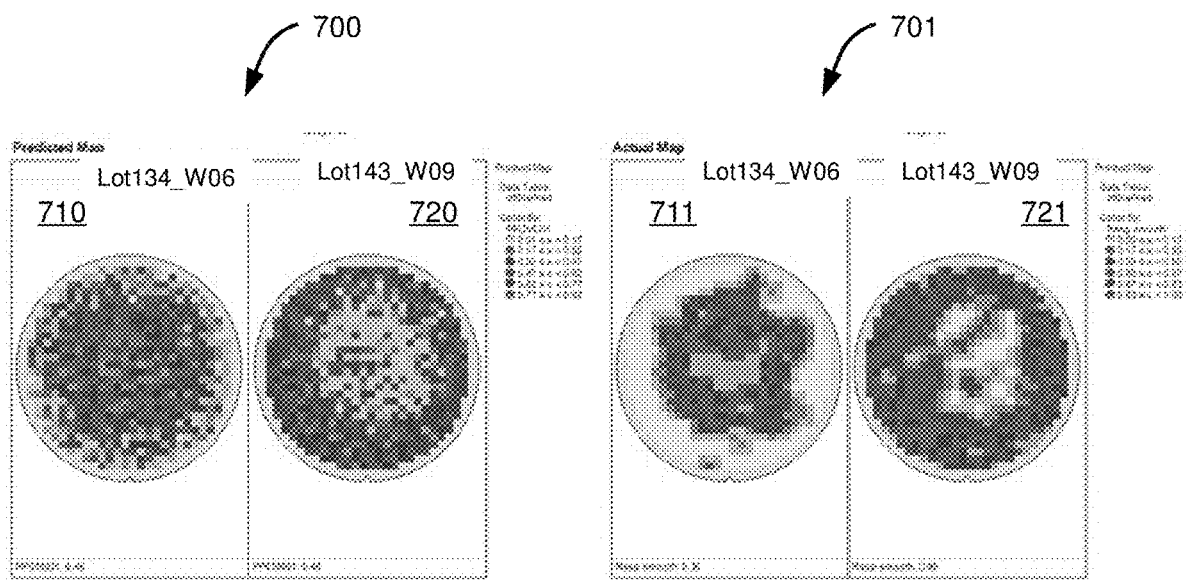
FIG. 7 are heat maps illustrating predicted spatial patterns and actual spatial patterns for two of the wafer samples from FIG. 2 after observation based on two parameters.

FIG. 7 further confirms the r-squared-based observations above, namely, that the second cumulative model does not significantly impact the prediction of wafer 220 (Lot143_W09), but now the prediction for wafer 210 (Lot134_W06) in panel 710 matches fairly well with the actual map shown in panel 711, thereby indicating that parameter PCM-1 is the culprit for this wafer (and no significant impact on wafer 220 as seen from similar maps in panel 720 and 721).

This approach can be used in this example for die level yield prediction, as described herein, or for any complex multi-variate machine learning problem, provided that there are separable identifiable root causes.

Figure 8:
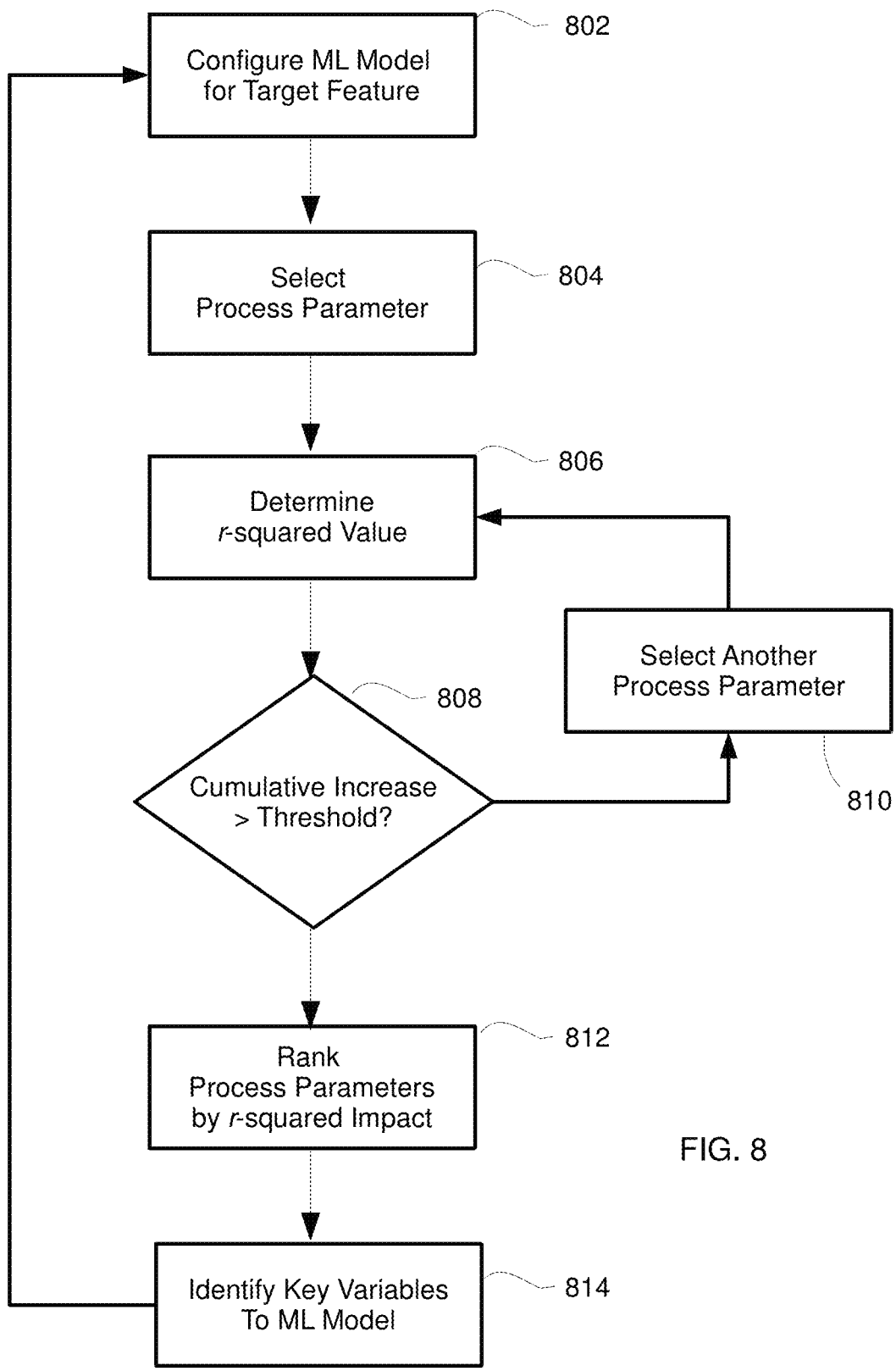
FIG. 8 is a flow chart illustrating a method for identifying cumulative impact of process parameters.

A flowchart is presented in FIG. 8 to describe the general method for a cumulative determination regarding key variables. In step 802, a machine learning model is configured to predict a target feature. In step 804, a process parameter is selected, and in step 806, the r-squared values for the prediction of the target feature on the basis of the selected process parameter are determined. The r-squared values are accumulated, and if the cumulative total continues to increase more than a threshold amount in step 808, then another process parameter is chosen in step 810, and the r-squared values for prediction of the target feature on the basis of the next selected process parameter are determined.

Once the cumulative total is no longer increasing significantly in step 808, i.e., the increase is less than the threshold, then the process parameters will be ranked in step 812 by r-squared values. Finally, in step 814, the highest-ranking process parameters, i.e., those parameters that have a demonstrated impact on the target features by virtue of the cross-validated r-square values approach, will be identifies as key variables to the ML model.

The invention claimed is:

1. A computer-implemented method for predicting yield for semiconductor devices in a semiconductor process, wherein a plurality of process parameters are associated with the yield of semiconductor devices, comprising:
configuring and training a machine learning model to predict yield based on an input data set having a selected plurality of the process parameters;
selecting a first parameter of the plurality of process parameters for the input data set, providing the input data set to the machine learning model, predicting yield based on the input data set, and determining a first r-squared value for a first prediction by the machine learning model based on the input data set;
selecting a second parameter of the plurality of process parameters and adding the second parameter to the input data set, providing the input data set to the machine learning model, predicting yield based on the input data set, and determining a second r-squared value for a second prediction by the machine learning model based on the input data set;
repeating a step of selecting an additional parameter of the plurality of process parameters, adding the additional parameter to the input data set, providing the input data set to the machine learning model, predicting yield based on the input data set, and determining an additional r-squared value for another prediction by the machine learning model based on the input data set;
accumulating all determined r-squared values until the accumulation increases by less than a threshold value;
ranking the plurality of selected parameters on the basis of respective r-squared values; and
identifying as inputs to include or exclude from the machine learning model on the basis of the ranking of selected parameters.

2. A computer-implemented method for predicting yield for semiconductor devices made in a semiconductor process, wherein a plurality of process variables are associated with yield, comprising:
providing a unique input data set to each of a plurality of processor-based models, each of the models programmed with instructions to predict yield based on a respective one of the unique input data sets;
wherein a first model of the plurality of models has a first input data set comprising a first variable of the plurality of process variables;
wherein a second model of the plurality of models has a second input data set comprising the first variable and a second variable of the plurality of process variables;
wherein successive additional models of the plurality of models have respective input data sets comprising the first variable, the second variable, and in succession, another variable added to the respective input data set;
wherein successive additional models each have a respective input data set consisting of the first variable, the second variable, and in succession, all variables that were added to the input data set of the immediately preceding model;
predicting yield using each of the plurality of models;
determining an r-squared value for each of a plurality of predictions made by respective ones of the plurality of models;
accumulating and ranking the respective r-squared values;
selecting ones of the plurality of process variables to include or exclude from a primary input data set based on the ranking of r-squared values; and
deploy a final model programmed with instructions to predict yield on the basis of the primary input data set.

3. A computer-implemented method for predicting yield for semiconductor devices made in a semiconductor process, wherein a plurality of process variables are associated with yield, comprising:
predicting yield using:
a first machine-learning-based model programmed with instructions to predict yield based on an input of a first variable of the plurality of process variables;
a second machine-learning-based model programmed with instructions to predict yield based on an input of the first variable and a second variable of the plurality of process variables;
a plurality of successive additional machine-learning-based models as necessary, each successive additional model programmed with instructions to predict yield based on an input of the first variable, the second variable, and adding a single additional variable of the plurality of process variables with each successive model;
determining a respective r-squared value for each prediction made by the models;
ranking the respective r-squared values of the predictions;
selecting ones of the plurality of process variables to include or exclude from a primary input data set based on the ranking of respective r-squared values; and
deploying a production model into the semiconductor process, the production model programmed with instructions to predict yield on the basis of the primary input data set.

4. The method of claim 3, further comprising:
using successive models to predict yield until all process variables have been provided as an input to a final one of the successive models.

5. The method of claim 3, further comprising:
accumulating the respective r-squared values of the predictions; and
using successive models to predict yield until an accumulation of the respective r-squared values of the predictions exceeds a threshold value.

6. The method of claim 3, further comprising:
accumulating the respective r-squared values of the predictions; and
using successive models to predict yield until an accumulation of the respective r-squared values of the predictions increases by less than a threshold value.

* * * * *